(12) United States Patent
Schunk

(10) Patent No.: US 6,735,023 B2
(45) Date of Patent: May 11, 2004

(54) OPTOELECTRONIC MODULE AND METHOD FOR ITS PRODUCTION

(75) Inventor: Nikolaus Schunk, Zeitlarn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/271,264

(22) Filed: Oct. 15, 2002

(65) Prior Publication Data

US 2003/0103278 A1 Jun. 5, 2003

(30) Foreign Application Priority Data

Oct. 15, 2001 (DE) ......................................... 101 51 113

(51) Int. Cl.[7] ................................................. G02B 7/02
(52) U.S. Cl. ........................................ 359/808; 359/819
(58) Field of Search ................................. 359/808, 811, 359/819

(56) References Cited

U.S. PATENT DOCUMENTS 5,050,963 A * 9/1991 Murakami .................. 359/808
5,094,518 A   3/1992 Musk
5,137,441 A * 8/1992 Fogarty ...................... 425/412
6,309,566 B1  10/2001 Müller et al.
2003/0007749 A1  1/2003 Hurt et al.

FOREIGN PATENT DOCUMENTS

DE  199 09 242 A1  8/2000
DE  199 18 859 A1  1/2001
DE  100 04 411 A1  8/2001

* cited by examiner

Primary Examiner—Ricky Mack
(74) Attorney, Agent, or Firm—Laurence A. Greenberg; Werner H. Stemer; Ralph E. Locher

(57) ABSTRACT

An optoelectronic module includes a transmitting and/or receiving element, a support on which the transmitting and/or receiving element is disposed, and a module housing having an opening for introducing the support and a coupling region for the coupling attachment of a component to be coupled on. The module housing is filled with a molding of a translucent, moldable material. A separate coupling lens for coupling light between the transmitting and/or receiving element and the component to be coupled on is provided, which lens is disposed adjacent to the molding in or just before the coupling region in the module housing. The invention also relates to several methods for producing such a module.

28 Claims, 10 Drawing Sheets

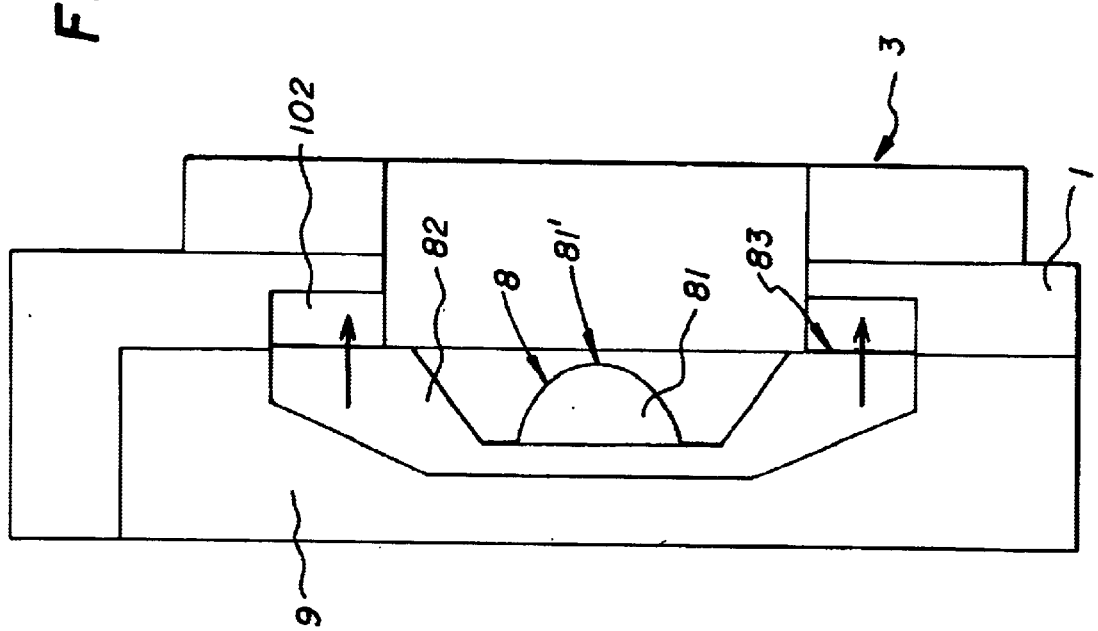
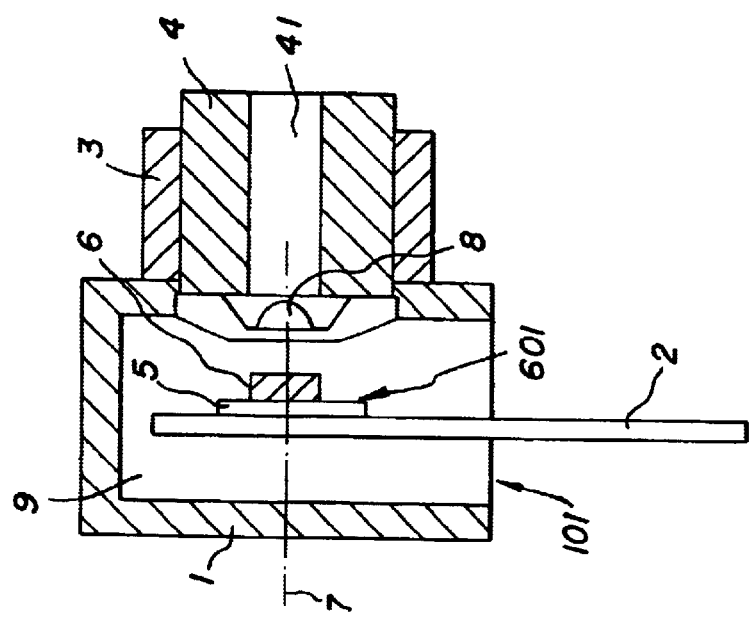

OPTOELECTRONIC MODULE AND METHOD FOR ITS PRODUCTION

BACKGROUND OF THE INVENTION

Field of the Invention

The invention relates to an optoelectronic module and to a method for its production. A preferred application area of the invention is that of low-cost optoelectronic modules that are coupled to Plastic Optical Fiber (POF) optical waveguides.

German Published, Non-Prosecuted Patent Application DE 199 09 242 A1, corresponding to U.S. Pat. No. 6,309,566 to Mueller, discloses an optoelectronic module and a method for its production in which a support with an optoelectronic transducer is positioned in a mold and surrounded with a translucent, moldable material. The moldable material in this case forms a molding that contains a functional surface serving for the coupling. The shaping of the functional surface takes place by a dead mold, which is shaped in a way corresponding to the functional surface and is removed once the moldable material has been introduced into the module housing.

A disadvantage of the prior art production method is that a dead mold is required for shaping the functional surface and this is a disposable part. A further disadvantage is that there is the risk of the functional surface formed by the moldable material in the molding being defectively produced. In particular, there is the risk of an air bubble being formed in the dead mold forming the functional surface during filling with the moldable material so that the functional surface is not formed as a converging lens and, instead, due to the air bubble, is formed as a diverging lens.

The problems described arise to an increased extent if a photodiode or a laser diode that has a smaller diameter in comparison with the component to be coupled on is used as the optoelectronic transducer. So, there is an especially high risk of an air bubble becoming lodged in the correspondingly small depressed formation of the dead mold and leading to the forming of a diverging lens instead of a converging lens.

SUMMARY OF THE INVENTION

It is accordingly an object of the invention to provide an optoelectronic module and method for its production that overcome the hereinafore-mentioned disadvantages of the heretofore-known devices and methods of this general type and that avoid the problems explained above and also make it possible to provide a precision-made coupling lens, in particular, even in the case of optoelectronic transducers of small diameter.

With the foregoing and other objects in view, there is provided, in accordance with the invention, an optoelectronic module, including an element, the element being at least one of a transmitting element and a receiving element, a support on which the element is disposed, a module housing defining an opening for introducing the support, the module housing having a coupling region for coupling a component thereat and an interior, a molding of a translucent, moldable material filling the interior of the module housing, and a separate coupling lens for coupling light between the element and the component, the lens disposed adjacent the molding one of in the coupling region and adjacent the coupling region.

Accordingly, in a first aspect of the invention, a coupling lens is disposed in the module housing in or just in front of the coupling region and adjacent to the molding. The coupling lens is formed as a separately produced part that, depending on the method of production used, is inserted into the module housing before or after the filling of the module housing with the molding material.

The coupling lens is, consequently, not formed by the molding but represents a separate part. By using a separately produced part as the coupling lens, it is ensured that the coupling lens has the desired light-shaping properties even in the case of small dimensions.

Preferably, the coupling lens is formed such that it completely closes the coupling region, in particular, toward the interior of the module housing. Such a feature has the advantage that the use of a dead mold or plug formed as a disposable part is superfluous because the module housing is already closed by the coupling lens.

In accordance with another feature of the invention, the coupling lens is accordingly inserted into the module housing before filling of the module housing with the moldable material. Insertion may, in such a case, take place from the inner side or else from the outer side. Preferably, the lens sealingly closes the coupling region with respect to the interior In accordance with a further feature of the invention, preferably, the coupling lens is shaped such that it has a holding edge, which radially adjoins the light-shaping region of the lens and bears against the module housing in the transitional region to the coupling region. A seal-tight connection with the module housing preferably takes place in such a case by a positive engagement, with peripheral grooves, recesses, or other positively engaging areas being formed in the module housing and/or the holding edge of the coupling lens. The holding edge may be formed integrally with the light-shaping region or represent a separate support, serving for positioning and securing, onto which the light-shaping region, i.e., the actual converging lens, is placed.

In accordance with an added feature of the invention, the module housing has an inner side, the holding edge has an edge region and a peripheral recess in the edge region forming an inner projection and an outer covering region of the holding edge, the lens protrudes with the inner projection into the coupling region and peripherally bears against the coupling region, and the covering region bears against the inner side of the module housing.

In accordance with an additional feature of the invention, the holding edge has a side facing away from the interior of the module housing and forms, on the side, a stop for coupling the component thereon.

In accordance with yet another feature of the invention, the holding edge of the coupling lens is formed with a cranked offset. The periphery of the holding edge in such a case forms, in the direction of the coupling region, a stop for a component to be coupled. The stop is offset axially with respect to the lens vertex in the direction of the coupling region so that there is no risk of an optical waveguide introduced into the coupling region in an abutting coupling with the coupling lens coming directly into contact with the light-shaping region, and possibly damaging the latter thereby.

In accordance with yet a further feature of the invention, the lens is a double lens.

In accordance with yet an added feature of the invention, the molding forms, in the coupling region, a depressed formation that, during the filling of the module housing with the molding, is formed by a projection of a correspondingly shaped dead mold that is removed after filling, and the coupling lens is inserted into this depressed formation of the molding. Unlike in U.S. Pat. No. 6,309,566 to Mueller, the depressed formation does not in such a case form a coupling lens, but represents a receiving and positioning aid for a separately made coupling lens. The coupling lens is, preferably, adhesively bonded into the associated depressed formation of the molding.

In accordance with yet an additional feature of the invention, the element has a smaller diameter than the component.

In accordance with again another feature of the invention, the coupling region is a protruding connecting piece forming a socket for receiving the component.

With the objects of the invention in view, there is also provided an optoelectronic module, including an element, the element being at least one of a transmitting element and a receiving element, a support on which the element is disposed, a module housing defining an opening for introducing the support, the module housing having a coupling region for coupling a component thereat and an interior, and a molding of a translucent, moldable material filling the interior of the module housing, the molding having a functional surface with an outer contour formed during filling of the module housing with the molding by a dead mold having an end face shaped to correspond to the outer contour and removed thereafter, the functional surface having a radially extending structure formed during filling of the module housing with the molding by a radially extending groove of the dead mold.

In accordance with again a further feature of the invention, there is also provided a separate coupling lens for coupling light between the element and the component, the lens being disposed at the functional surface.

With the objects of the invention in view, there is also provided an optoelectronic module, including an element, the element being at least one of a transmitting element and a receiving element, a support on which the element is disposed, a module housing defining an opening for introducing the support, the module housing having a coupling region for coupling a component thereat and an interior, and a molding of a translucent, moldable material filling the interior of the module housing, the molding having a dead-mold-shaped functional surface having an outer contour and a radially extending structure.

In a further aspect of the invention, there is provided an optoelectronic module in which the module housing is filled with a moldable, translucent molding that forms a functional surface, which is formed during the filling of the module housing with the molding by a dead mold that is shaped on its end face in a way corresponding to the outer contour of the functional surface and is removed thereafter. According to the invention, the functional surface has a radially extending structure that is formed during the filling of the module housing with the molding by a radially extending groove of the dead mold. The radially extending groove of the dead mold is perpendicularly aligned during the filling with the moldable material and, consequently, makes it possible for air bubbles forming in the corresponding recess of the dead body to rise up and to be dissipated. As a result, it is ensured that the coupling lens integrated directly into the molding can be produced free from bubbles. However, due to the groove or the structure produced by the latter in the coupling lens, a reduced coupling efficiency must be accepted.

With the objects of the invention in view, there is also provided a method for producing an optoelectronic module with a molding, including the steps of providing a support with an element being at least one of a transmitting element and a receiving element, providing a module housing with an opening for introducing the support therethrough and a coupling region for coupling a component thereon, positioning the support in the module housing to align the element with a predetermined position, at least partly surrounding the support and the element with a translucent, moldable material to form a molding utilizing the module housing as a casting mold, and before filling the moldable material into the module housing, closing the coupling region with a coupling lens aligned with the element.

A first method according to the invention for producing an optoelectronic module is distinguished by the fact that, before filling the moldable material into the module housing, the coupling region is closed with a coupling lens aligned with respect to the transmitting and/or receiving element. The use of a separate dead mold is not required in such a case. The side of the lens facing the interior of the housing is, preferably, of such a nature that the casting compound forms a good bond with the lens during curing. This can be assisted by corresponding selection of the material of the lens.

With the objects of the invention in view, there is also provided a method for producing an optoelectronic module with a molding, including the steps of providing a support with an element being at least one of a transmitting element and a receiving element, providing a module housing with an opening for introducing the support therethrough and a coupling region for coupling a component thereon, positioning the support in the module housing to align the element with a predetermined position, at least partly surrounding the support and the element with a translucent, moldable material to form a molding utilizing the module housing as a casting mold while placing a dead mold in the coupling region, forming a depressed formation in the molding material with a projection of the dead mold during the filling of the module housing with the molding material, removing the dead mold after filling the moldable material in the module housing, and inserting a coupling lens into the depressed formation after the dead mold has been removed.

A second method for producing an optoelectronic module according to the invention uses a separate dead mold and is distinguished by the fact that, during the filling of the module housing with the molding, a depressed formation is formed in the molding material by a projection of the correspondingly shaped dead mold and the coupling lens is inserted into such a depressed formation once the dead mold has been removed. The depressed formation in such a case represents a receiving and positioning aid for the coupling lens inserted after curing of the molding material.

With the objects of the invention in view, there is also provided a method for producing an optoelectronic module with a molding, including the steps of providing a support with an element being at least one of a transmitting element and a receiving element, providing a module housing with an opening for introducing the support therethrough and a coupling region for coupling a component thereon, positioning the support in the module housing to align the element with a predetermined position, placing a rear side of a coupling lens on an end face of a dead mold, the end face of the dead mold being shaped to correspond to the rear side of the coupling lens, and introducing the coupling lens into the module housing with the dead mold, at least partly surrounding the support and the element with a translucent, moldable material to form a molding utilizing the module housing as a casting mold while keeping the dead mold in the coupling region, holding the coupling lens with the dead mold until the module housing is filled with the molding material, and removing the dead mold after filling the moldable material in the module housing.

A third method for producing an optoelectronic module according to the invention likewise uses a separate dead mold and is distinguished by the fact that a coupling lens is disposed on the end face of the dead mold, is introduced into the module housing by the dead mold, and is held by the latter until filling with the molding, the end face of the dead mold being formed in a way corresponding to the rear side of the lens. The side of the lens facing the interior of the housing is in such a case, preferably, of such a nature that the casting compound forms a good bond with the lens during curing.

This variant of the invention has the advantage that the coupling lens is brought into the desired position in the interior of the housing by the dead mold and no stop for the coupling lens is required on the housing. The coupling lens is held in the housing by its adhesive bond with the molding.

With the objects of the invention in view, there is also provided a method for producing an optoelectronic module with a molding, including the steps of providing a support with a transceiver element, providing a module housing with an opening for introducing the support therethrough and a coupling region for coupling a component thereon, positioning the support in the module housing to align the element with a predetermined position of the coupling region, placing a coupling lens on an end face of a dead mold and locating the coupling lens at the coupling region of the module housing, at least partly surrounding the support and the element with a translucent, moldable material to form a molding utilizing the module housing as a casting mold while keeping the dead mold at the coupling region, holding the coupling lens with the dead mold until the module housing is filled with the molding material, and removing the dead mold after filling the moldable material in the module housing.

Other features that are considered as characteristic for the invention are set forth in the appended claims.

Although the invention is illustrated and described herein as embodied in an optoelectronic module and method for its production, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a cross-sectional view through a first exemplary embodiment of an optoelectronic module according to the invention with a module housing and a support, introduced into the module housing, with a transmitting and/or receiving element and a coupling lens;

FIG. 2 is an enlarged, fragmentary cross-sectional view of an alternative embodiment of the coupling lens of FIG. 1;

DESCRIPTION OF THE PREFERRED EMBODIMENTS

Figure 3:
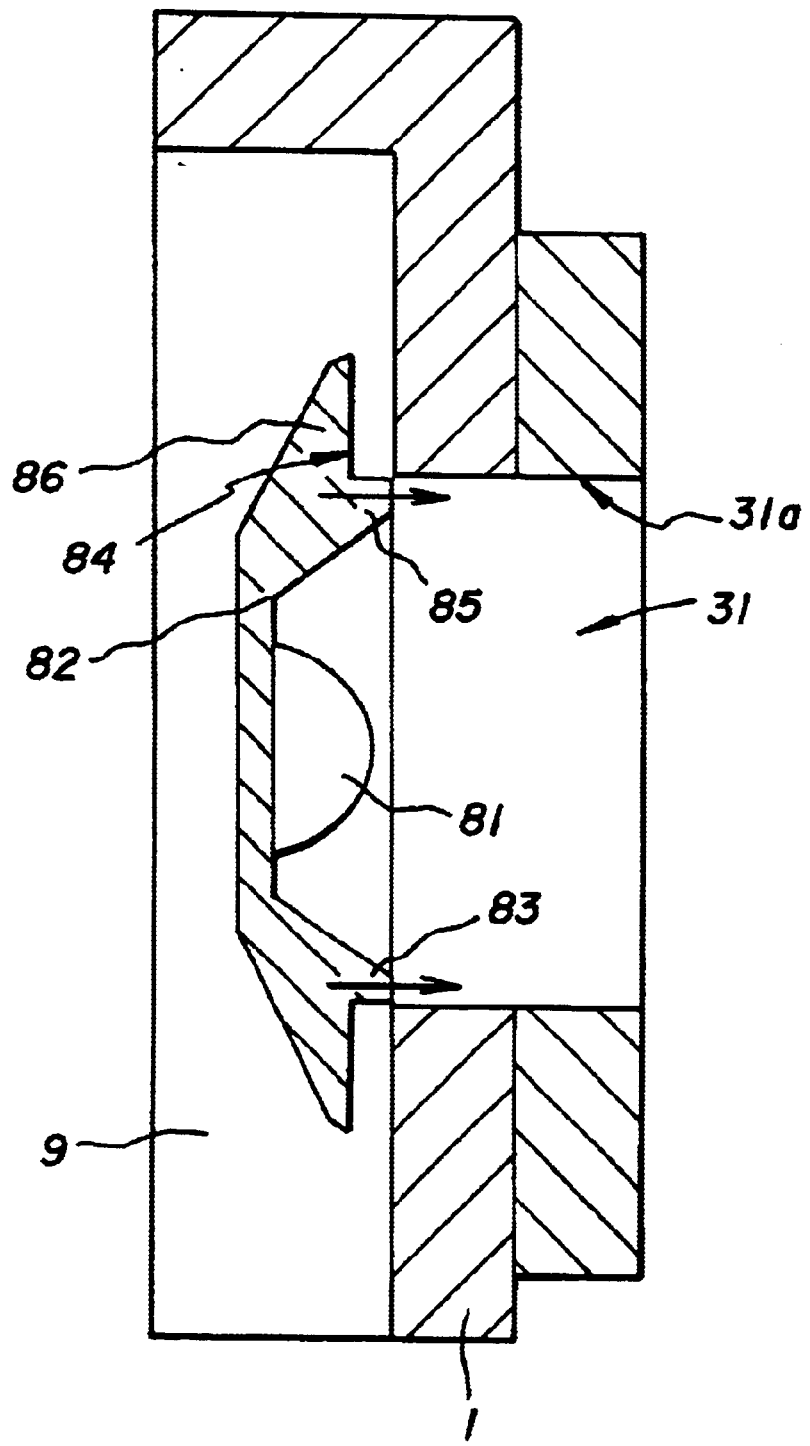
FIG. 3 is an enlarged, fragmentary cross-sectional view of another embodiment of the coupling lens of FIG. 1.

Referring now to the figures of the drawings in detail and first, particularly to FIG. 1 thereof, there is shown an optoelectronic module with a module housing 1, which is also referred to as a Cavity-As-Interface (CAI) housing, which has, on one hand, a receiving opening 101 for introducing a support 2 and, on the other hand, a coupling region 3 for receiving an optical waveguide 4 (also referred to as an optical fiber).

Disposed on the support 2, on a submount 5, is a transmitting and/or receiving element 6 (also referred to as an electro-optical transducer), which is, in particular, a photodiode, a light-emitting diode, or a vertically emitting laser. The optically active region 601 of the transmitting and/or receiving element 6 is aligned, with respect to the support 2 and in the module housing 1, such that its axis of symmetry 7 (also referred to as an optical axis) coincides with the axis of the coupling region 3.

The coupling region 3 is formed as a connecting piece or stub projecting perpendicularly from the module housing 1 and having a receiving opening 31 for receiving and fixing the optical waveguide 4 (also referred to as a plastic fiber) to be coupled on, which is preferably a plastic fiber. See FIG. 3. As FIG. 1 reveals, the diameter of the plastic fiber 4 is greater than the diameter of the transmitting and/or receiving element 6. The diameter of the transmitting and/or receiving element 6 is, for example, of the same order of magnitude as the diameter of the core 41 of the plastic fiber 4, which is approximately 1 mm.

For coupling light between the transmitting and/or receiving element 6 and the optical waveguide 4, a coupling lens 8 has been inserted into the housing 1 in the transitional region to the coupling region 3. The coupling lens 8 is adjacent to a molding 9 of a translucent, moldable material, which is filled into the module housing 1 through the receiving opening 101 and forms the molding 9 after curing.

The coupling lens 8 is represented in more detail in FIG. 2. The coupling lens 8 has a light shaping, spherically, or, else, aspherically formed lens region 81 (also referred to as a light-shaping region), which forms the actual converging lens, and a holding edge 82 radially adjoining the latter. The holding edge 82 has end faces 83 that point away from the transmitting and/or receiving element 6 and against which the optical fiber 4 comes to bear (see FIG. 1).

Furthermore, the holding edge 82 is formed with a cranked offset, i.e., the end faces 83 pointing away from the transmitting and/or receiving element 6 are offset axially with respect to the lens vertex 81' of the light-shaping lens region 81 in the direction of the coupling region 3. The axial distance is, for example, 50 μm.

The cranked form of the holding edge has the advantage that an optical fiber 4 introduced into the coupling region 3 in an abutting coupling with the end face 83 of the holding edge 82 does not come into contact with the light-shaping region 81. Thus, the light-shaping region 81 cannot be damaged.

For the purpose of a positive connection of the lens 8 with the module housing 1, in the module housing 1 of FIG. 2 there is a peripheral annular groove 102, into which the holding edge 82 of the lens 8 is inserted with positive engagement. In such a case, the lens 8 closes off the coupling region 3 of the module in a sealing manner. It is inserted into the module housing 1 before filling with the moldable material (casting resin), which, after curing, forms the molding and closes off the coupling region 3 with respect to the interior of the module housing. Consequently, the use of a separate dead mold or a plug for closing the coupling region 3 when introducing the casting resin is rendered superfluous.

FIG. 3 shows an alternative refinement of the edge region 82 of the coupling lens 8. For the purpose of a positive connection with the module housing 1, formed in the holding edge 82 there is a recess 84, by which the holding edge 82 forms, on one hand, a projection 85, protruding into the opening 31 of the coupling region 3, and, on the other hand, an outer, radially extending covering region 86. After inserting the lens 8 into the coupling region 3, the projection 85 protrudes into the opening 31 of the coupling region 3 and comes to bear in a sealing manner against the inner side 31a of the coupling region 3. The coupling region 86, on the other hand, bears against the inner side of the module housing 1. As such, the lens 8 provides a sealed termination of the coupling region 3.

Moreover, it is also the case in the exemplary embodiment of FIG. 3 that the holding edge 82 is formed with a cranked offset and is provided with stop faces 83.

The embodiment of FIG. 3 has the advantage over the embodiment of FIG. 2 that no modification of a standard module housing by introducing a round groove 102 (cf. FIG. 2) is required. Such a round groove can be produced during the production of the module housing by an injection mold only by a projecting hinge in the injection mold, which must be removed again before filling with molding material. The need for a movable mold insert for the injection mold is disadvantageous, however, and is avoided in the case of the exemplary embodiment of FIG. 3.

In alternative refinements, other positive connections of the holding edge 82 on the module housing 1 are provided.

Figure 4:
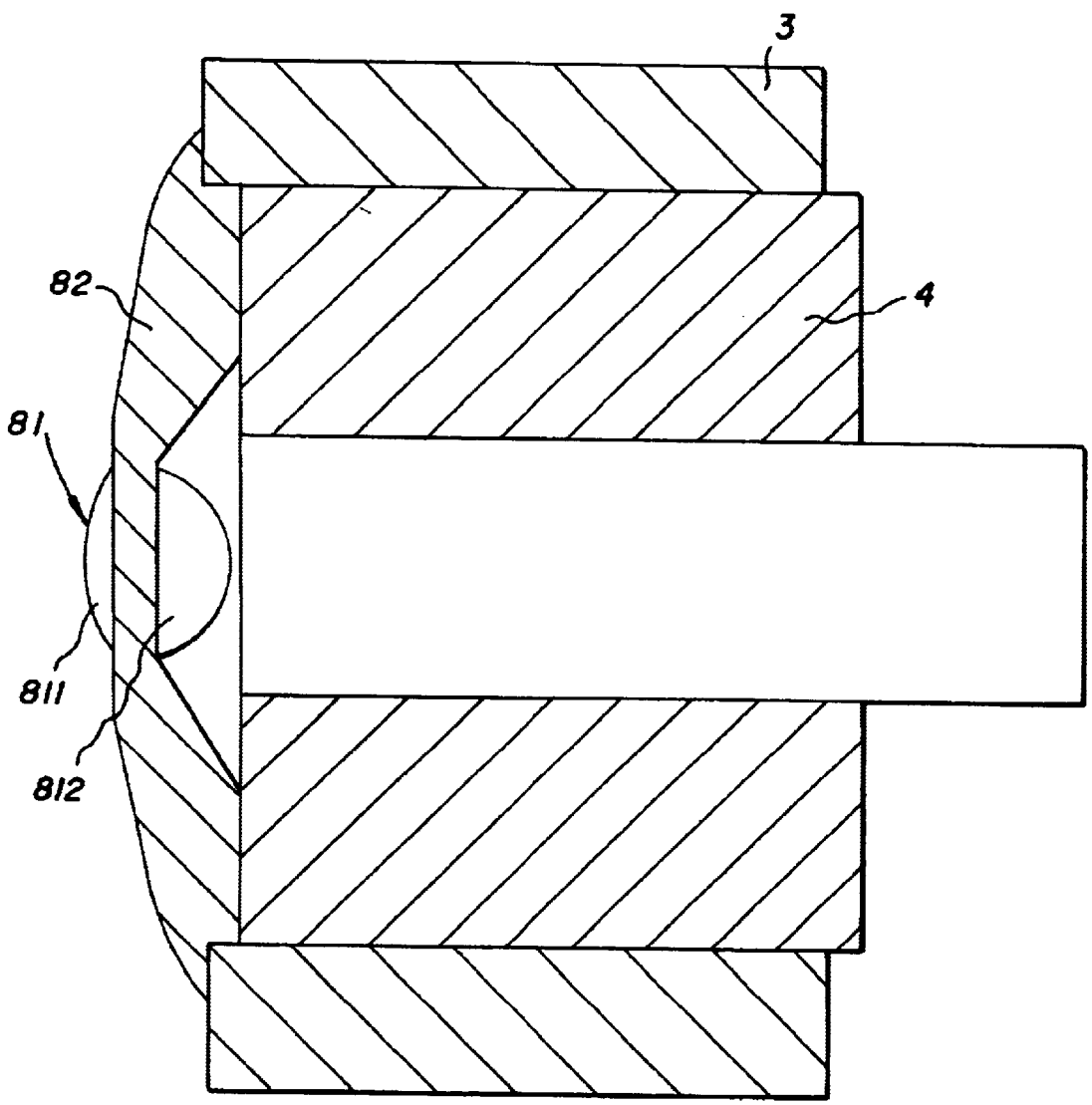
FIG. 4 is an enlarged, fragmentary cross-sectional view of a third embodiment of the coupling lens of FIG. 1.

FIG. 4 shows an alternative exemplary embodiment, in which the light-shaping region 81 of the coupling lens 8 is formed as a double lens with a lens region 811 toward the electro-optical transducer 6 and a lens region 812 toward the optical fiber 4. The two lens regions 811, 812 are, preferably, aspherically formed.

Figure 5:
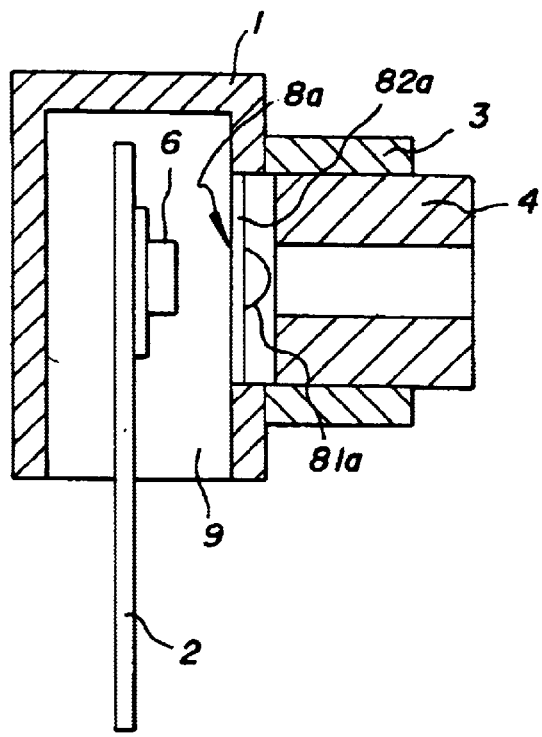
FIG. 5 is a cross-sectional view of a second exemplary embodiment of an optoelectronic module according to the invention with a module housing, an introduced support, and a coupling lens.

FIG. 5 shows a refinement of an optoelectronic module in which a coupling lens 8a is mechanically fixed on the hardened molding 9, in particular, is adhesively attached thereon. For closing the coupling region 3 when filling the module housing 1 with the molding material, a non-illustrated plug with a planar end face is inserted into the coupling region 3 and is removed again after the hardening of the molding material.

The coupling lens 8a is, then, adhesively attached to the molding 9 in the coupling region 3. The coupling lens 8a has, in turn, a beam-shaping lens region 81a and a radially adjoining holding edge 82a, which allows reliable positioning and fixing of the beam-shaping region 81 in the coupling region 3 and on the optical axis 7 of the transmitting and/or receiving element 6. In principle, the holding edge 82a may in such a case also have a smaller diameter than the coupling region 3 or it can be dispensed with entirely.

The exemplary embodiment of FIG. 5 has a certain disadvantage insofar as there is a relatively great, not optimal, distance between the lens 8 with its light-shaping region 81a and the transmitting and/or receiving element 6, with the result that the coupling efficiency is not optimal. Therefore, it is desirable to aim for solutions in which the coupling lens is at a shorter distance from the transmitting and/or receiving element 6 where, accordingly, there is better coupling efficiency.

Figure 6:
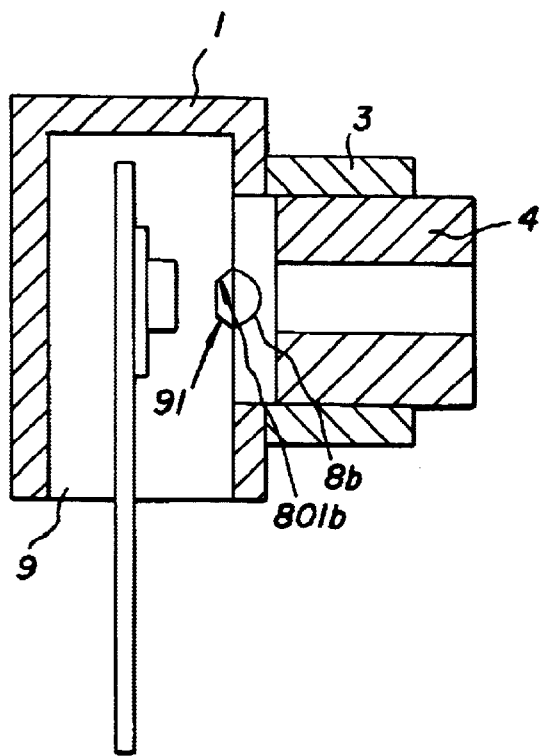
FIG. 6 is a cross-sectional view of a third exemplary embodiment of an optoelectronic module according to the invention with a module housing, an introduced support, and a coupling lens.

To achieve such a characteristic, in the exemplary embodiment of FIG. 6, there is formed in the molding 9 a depression 91, which was formed by a dead mold or plug, having a corresponding projection, when the molding material was introduced into the module housing 1. A coupling lens 8b has a rear facet 801b, by which it is adhesively bonded into the depression 91.

Figure 7:
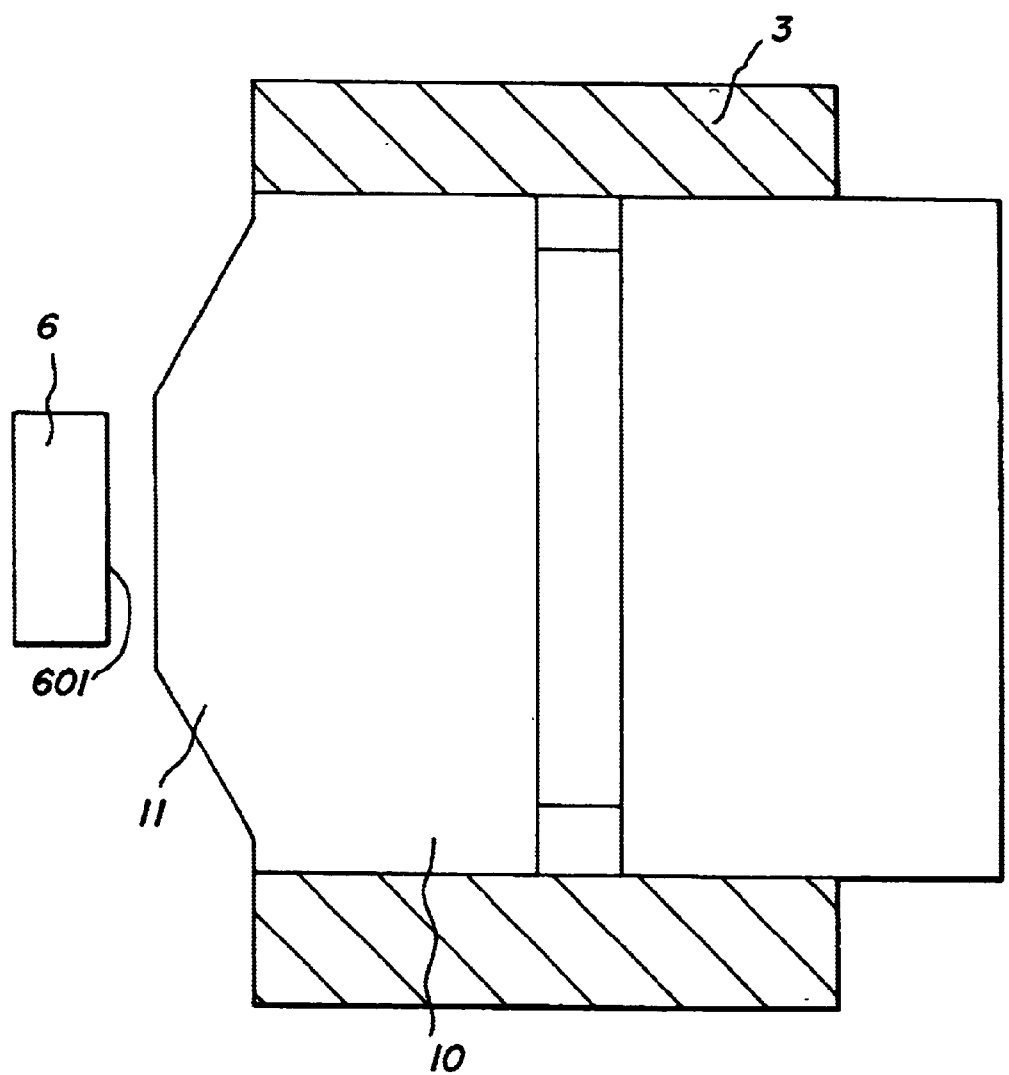
FIG. 7 is an enlarged, fragmentary cross-sectional view of a variant of the module of FIG. 6, with a plug being introduced into the coupling region of the module housing in a first step, having the effect of producing a depression in the molding of the module.
Figure 8:
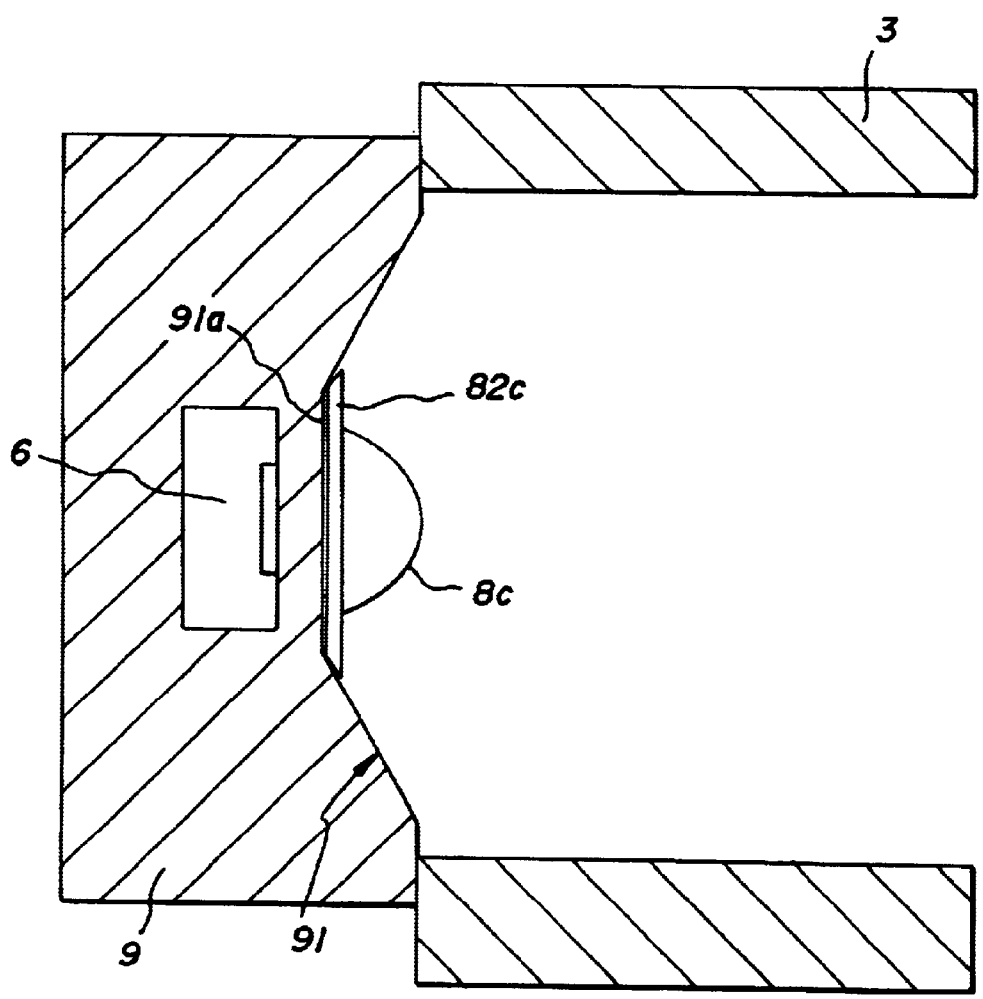
FIG. 8 is an enlarged, fragmentary cross-sectional view of the module of FIG. 7 with a lens having been inserted into the depression of the molding.

FIGS. 7 and 8 show a further exemplary embodiment, in which a recess for receiving a coupling lens is formed in the molding 9. Represented in FIG. 7 is a plug 10, which is inserted into the coupling region 3 before filling of the module housing 1 with molding material and provides a dead mold. The plug 10 has a projection 11, which, in the exemplary embodiment represented, is circular-symmetrical and frustoconical. After filling the molding material into the module housing 1, pulling the plug 10 out of the coupling region 3 and hardening of the molding material to form the molding 9, there is in the latter a corresponding depression or recess 91 (cf. FIG. 8). According to FIG. 8, a coupling lens 8c is, then, adhesively bonded into the recess 91, with a receiving and positioning surface for the holding edge 82c of the coupling lens 8c being provided by the base 91a of the recess 91.

Figure 9:
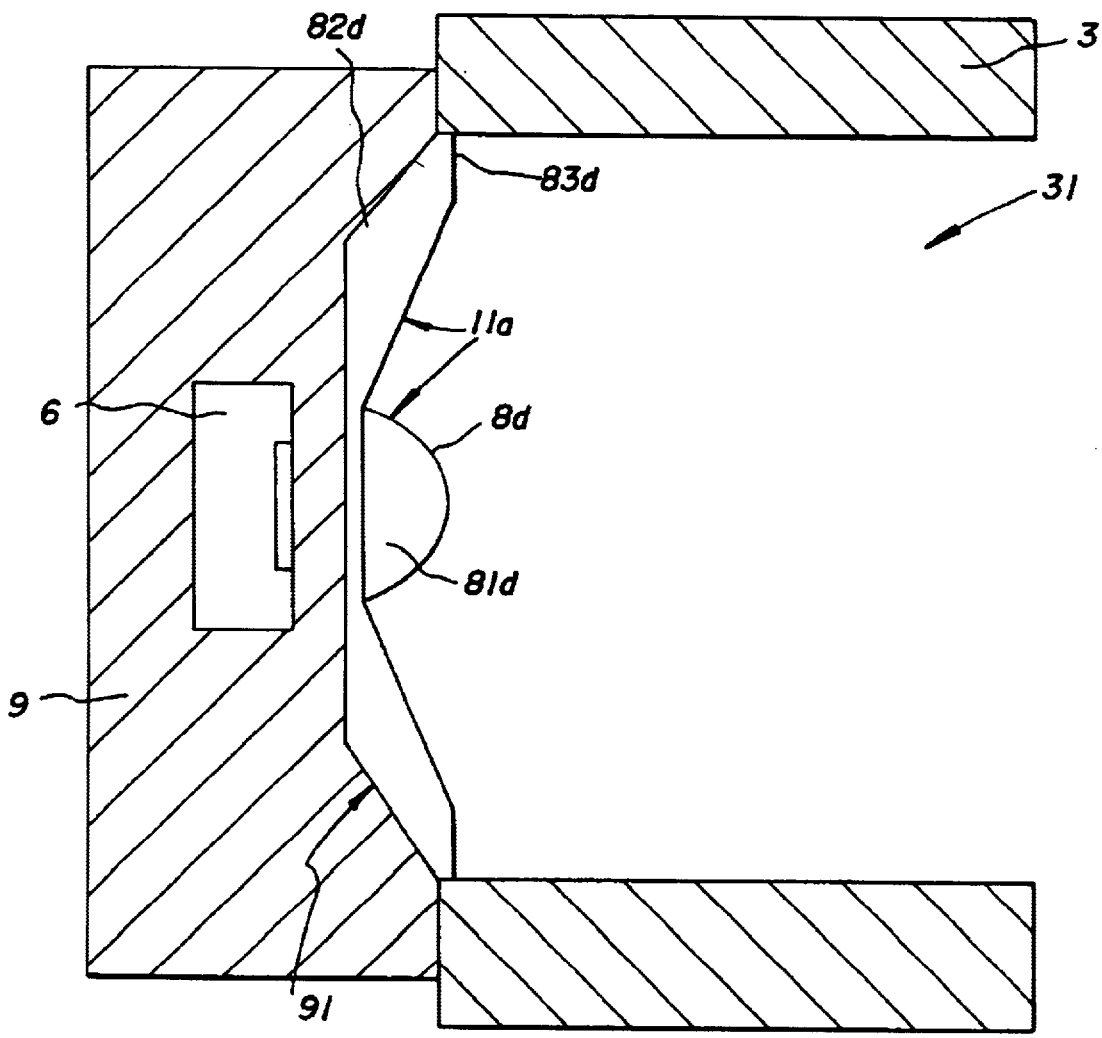
FIG. 9 is an enlarged, fragmentary cross-sectional view of an alternative embodiment of FIGS. 7 and 8 with a coupling lens that seals the coupling region having been inserted into the depression of the molding.

In the case of the exemplary embodiment of FIG. 9, a coupling lens 81d made with a cranked offset, configured in a way similar to the coupling lenses represented in FIGS. 2 and 3 and fitted exactly into the receiving opening 31 of the coupling region 3, has been introduced into the depression 91 of the molding 9. In particular, the holding edge 82d is cranked with respect to the light-shaping region 81d and, consequently, protrudes with its peripheral stop faces 83d in the direction of the coupling region 3. However, a positive connection with the module housing 1 is not required because the coupling lens 8d is fastened to the molding 9 only after the molding 9 has been introduced.

In the case of the exemplary embodiments of FIGS. 6 to 9, it may alternatively be provided that the coupling lenses 8c, 8d are not adhesively attached on the molding 9 at a subsequent time but are already positioned in the module housing 1 before the molding material is forced in. For such a purpose, the coupling lens 8c, 8d is placed onto the end face of the plug 10 (cf. FIG. 7), which has a form corresponding to the rear side of the lens (corresponding to the form 11a indicated in FIG. 9). The plug 11 serves, to a certain extent, as a support and securing device for the coupling lens. After the casting resin or molding material has been forced into the module housing 1, a cohesive or adhesive bond takes place between the coupling lens 8c, 8d and the molding 9. This may involve the side of the coupling lens facing the molding being made to dissolve slightly so that a particularly good bond is produced between the lens 8c, 8d and the molding 9. After curing of the molding compound 9, the plug 10 is, then, removed again.

Such a method has the advantage that the coupling lens is fastened to the molding 9 directly while the latter is being produced and this can take place by the plug in a form aligned exactly with respect to the transmitting and/or receiving element 6. There is also no need for structures that bring about a positive connection on the holding edge of the lens or on the module housing.

Figure 10:
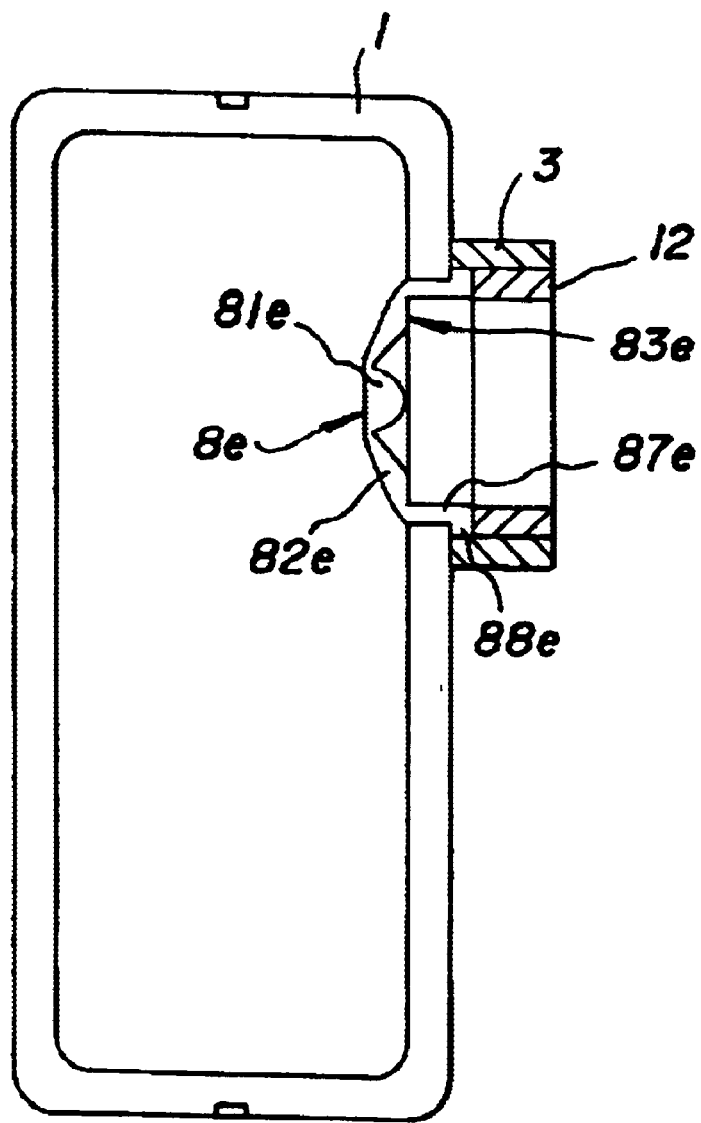
FIG. 10 is a cross-sectional view of an embodiment of an optoelectronic module housing according to the invention with an inserted coupling lens and before introducing the support.
Figure 11:
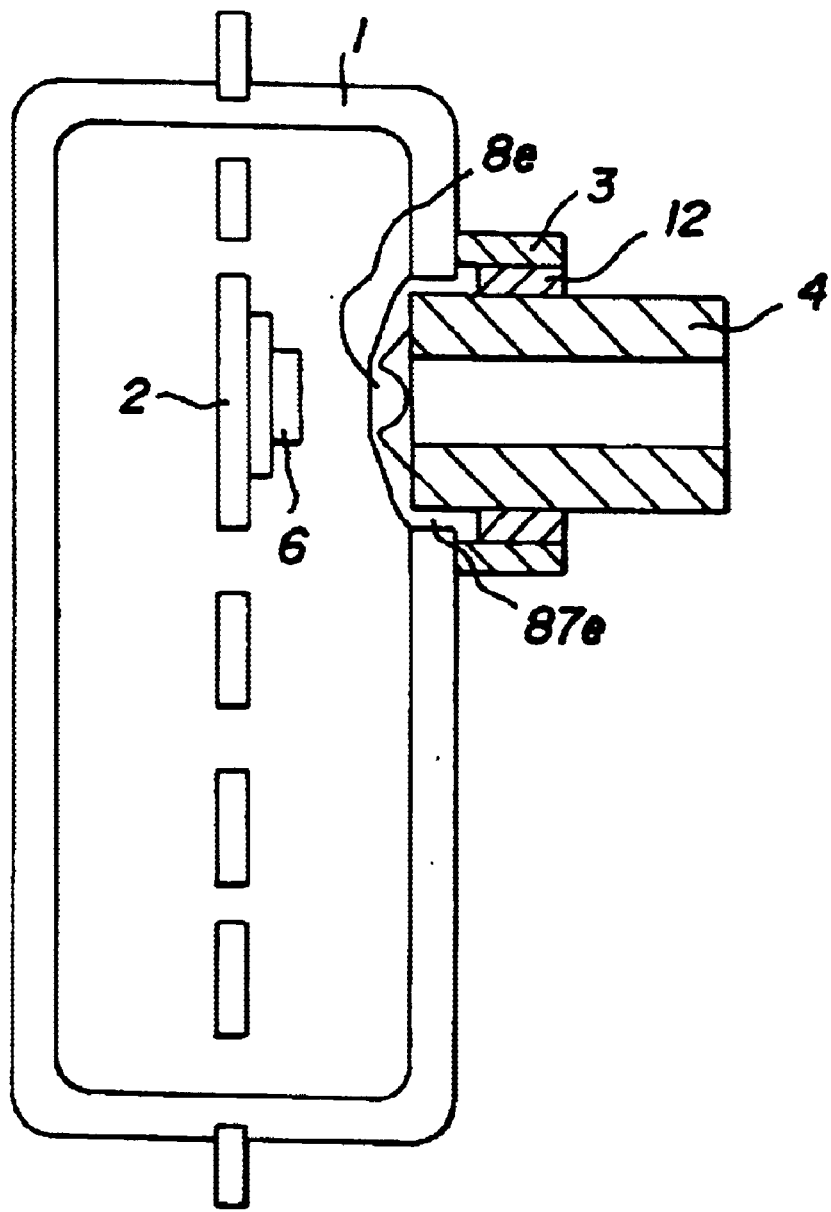
FIG. 11 is a cross-sectional view of the module of FIG. 10 after introducing the support and coupling attachment of a plastic optical fiber.

FIGS. 10 and 11 show a further embodiment of an optoelectronic module. In the case of this embodiment, a lens 8e including a beam-shaping, central region 81e and an, in turn, cranked holding edge 82e is inserted from the outer side into the housing opening for the coupling region 3 of the module housing 1. For positively attaching the holding edge 82e to the module housing 1, the holding edge 82e has a peripheral, cylindrical collar 87e, which is inserted into the housing opening and has outer projections 88e, which bear from outside against the module housing.

After introducing the coupling lens 8e into the opening 31 of the coupling region 3, a guard ring 12 is pushed into the coupling region 3, comes to bear against the cylindrical collar 87e of the holding edge 82a and is in line with it. The guard ring 12 prevents the undesired coupling of stray radiation into the interior of the module.

In FIG. 11, the support 2 with the transmitting and/or receiving element 6 has also been introduced into the module housing 1. In such a case, the molding compound is introduced into the housing in front of the support 2 (from above in the plane of the drawing). Closing of the coupling region 3 takes place by the coupling lens 8e so that a separate dead mold is not required. After curing of the molding material, a plastic fiber 4 is pushed into the coupling region 3. The holding edge 82e of the lens 8e in this case forms, in addition to the collar 87e protruding out of the housing, a stop face 83e (cf. FIG. 10) for the plastic fiber 4.

Figure 12B:
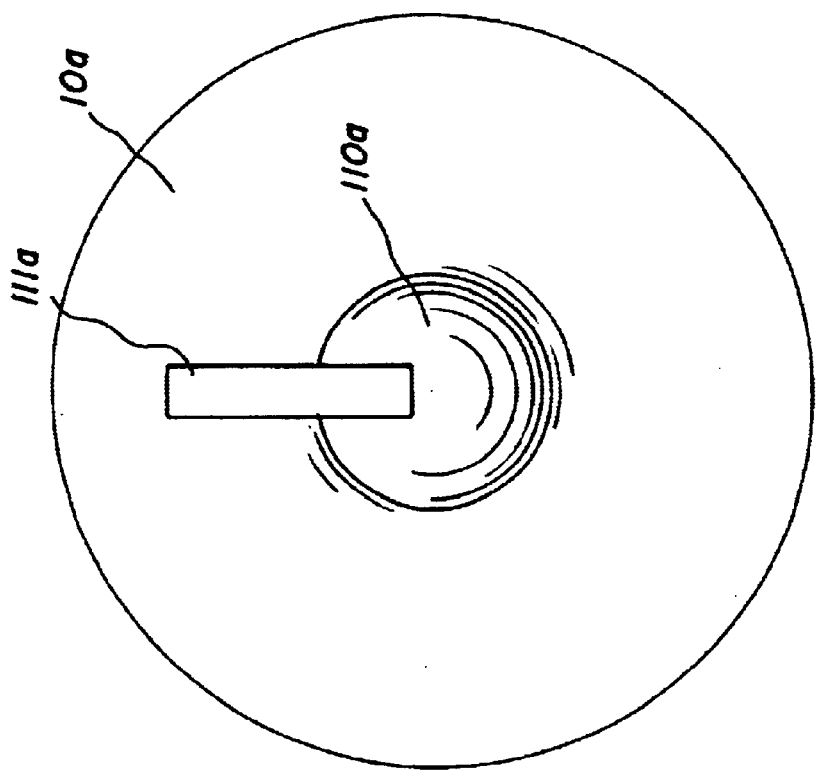
FIG. 12B is a plan view of an end region of the plug of FIG. 12A.
Figure 12A:
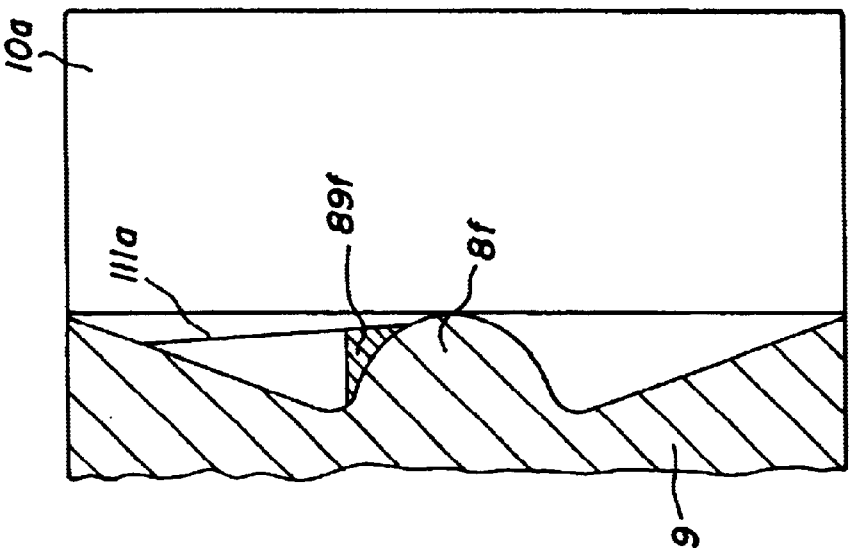
FIG. 12A is a fragmentary, cross-sectional view of an exemplary embodiment of a plug with an integrated lens and radial groove according to the invention that is to be introduced into the coupling region of the module housing of an optoelectronic module during the filling with a molding material.

FIGS. 12A and 12B show a sectional representation in a front view of a dead mold or plug 10a, as can be used in the case of an optoelectronic module and a method such as that described in U.S. Pat. No. 6,309,566 to Mueller. The plug has a central recess 110a, which corresponds to the form of a coupling lens 8f to be formed in the molding 9.

As a departure from the method disclosed in Mueller, the recess 110a of the plug 10a is connected to a venting groove 111a, which extends vertically during the filling operation and is formed in the plug 10a. The plug 10a has, in such a case, on its rear side, a display similar to a clock, by which the vertical alignment of the venting groove 111a can be set.

The venting groove 111a ensures that, even in the case of small lenses 8f to be formed in the molding 9, no disturbing air bubbles collect in the recess 110a during the casting operation. Rather, any air bubbles can rise up and away through the venting groove 111a. Consequently, the exemplary embodiment represented makes it possible for a coupling lens to be produced free from bubbles, the lens being formed by molding material flowing into the depression 110a during the casting operation and including an integral part of the molding 9. However, corresponding to the groove 111a, in the coupling lens 8f there is formed a, likewise, vertical structure 89f that slightly reduces the coupling efficiency.

I claim:

1. An optoelectronic module, comprising:
   an element, said element being at least one of a transmitting element and a receiving element;
   a support on which said element is disposed;
   a module housing defining an opening for introducing said support, said module housing having:
   a coupling region for coupling a component thereat; and
   an interior;
   a molding of a translucent, moldable material filling said interior of said module housing; and
   a separate coupling lens for coupling light between said element and the component, said lens disposed adjacent said molding one of:
   in said coupling region; and
   adjacent said coupling region.

2. The module according to claim 1, wherein said lens completely closes said coupling region toward said interior of said module housing.

3. The module according to claim 2, wherein said lens is inserted into said module housing before filling said module housing with said molding and sealingly closes said coupling region with respect to said interior.

4. The module according to claim 1, wherein said lens has:
   a light-shaping region; and
   a holding edge radially adjoining said light-shaping region and bearing against said module housing.

5. The module according to claim 4, wherein:
   said module housing has:
   a transitional region connected to said coupling region; and
   a peripheral groove in said transitional region; and
   said holding edge is inserted into said peripheral groove.

6. The module according to claim 4, wherein:
   said module housing has an inner side;
   said holding edge has an edge region and a peripheral recess in said edge region forming an inner projection and an outer covering region of said holding edge;
   said lens protrudes with said inner projection into said coupling region and peripherally bears against said coupling region; and
   said covering region bears against said inner side of said module housing.

7. The module according to claim 4, wherein said holding edge has a side facing away from said interior of said module housing and forms, on said side, a stop for coupling the component thereon.

8. The module according to claim 5, wherein said holding edge has a side facing away from said interior of said module housing and forms, on said side, a stop for coupling the component thereon.

9. The module according to claim 6, wherein said holding edge has a side facing away from said interior of said module housing and forms, on said side, a stop for coupling the component thereon.

10. The module according to claim 9, wherein:
said lens has a lens vertex;
said holding edge is cranked; and
said stop is offset axially with respect to said lens vertex in a direction of said coupling region.

11. The module according to claim 1, wherein said lens is a double lens.

12. The module according to claim 4, wherein said lens and said holding edge are integral.

13. The module according to claim 4, wherein:
said holding edge is a separate support for said lens; and
said lens is fastened on said support.

14. The module according to claim 1, wherein:
said molding defines a depressed formation in said coupling region; and
said coupling lens is inserted into said depressed formation.

15. The module according to claim 14, wherein a projection forms said depressed formation during filling of said module housing with said molding, said projection being a correspondingly shaped dead mold removed after filling of said module housing.

16. The module according to claim 15, wherein said lens is adhesively attached to said molding.

17. The module according to claim 1, wherein said element has a smaller diameter than the component.

18. The module according to claim 1, wherein said coupling region is a protruding connecting piece forming a socket for receiving the component.

19. An optoelectronic module, comprising:
an element, said element being at least one of a transmitting element and a receiving element;
a support on which said element is disposed;
a module housing defining an opening for introducing said support, said module housing having:
a coupling region for coupling a component thereat; and
an interior; and
a molding of a translucent, moldable material filling said interior of said module housing, said molding having a functional surface with an outer contour formed during filling of said module housing with said molding by a dead mold having an end face shaped to correspond to said outer contour and removed thereafter, said functional surface having a radially extending structure formed during filling of said module housing with said molding by a radially extending groove of the dead mold.

20. The module according to claim 19, wherein said element has a smaller diameter than the component.

21. The module according to claim 19, wherein said coupling region a protruding connecting piece forming a socket for receiving the component.

22. The module according to claim 19, including a separate coupling lens for coupling light between said element and the component, said lens being disposed at said functional surface.

23. An optoelectronic module, comprising:
an element, said element being at least one of a transmitting element and a receiving element;
a support on which said element is disposed;
a module housing defining an opening for introducing said support, said module housing having:
a coupling region for coupling a component thereat; and
an interior; and
a molding of a translucent, moldable material filling said interior of said module housing, said molding having a dead-mold-shaped functional surface having an outer contour and a radially extending structure.

24. The module according to claim 23, including a separate coupling lens for coupling light between said element and the component, said lens being disposed at said functional surface.

25. A method for producing an optoelectronic module with a molding, which comprises:
providing a support with an element being at least one of a transmitting element and a receiving element;
providing a module housing with an opening for introducing the support therethrough and a coupling region for coupling a component thereon;
positioning the support in the module housing to align the element with a predetermined position;
at least partly surrounding the support and the element with a translucent, moldable material to form a molding utilizing the module housing as a casting mold; and
before filling the moldable material into the module housing, closing the coupling region with a coupling lens aligned with the element.

26. A method for producing an optoelectronic module with a molding, which comprises:
providing a support with an element being at least one of a transmitting element and a receiving element;
providing a module housing with an opening for introducing the support therethrough and a coupling region for coupling a component thereon;
positioning the support in the module housing to align the element with a predetermined position;
at least partly surrounding the support and the element with a translucent, moldable material to form a molding utilizing the module housing as a casting mold while placing a dead mold in the coupling region;
forming a depressed formation in the molding material with a projection of the dead mold during the filling of the module housing with the molding material;
removing the dead mold after filling the moldable material in the module housing; and
inserting a coupling lens into the depressed formation after the dead mold has been removed.

27. A method for producing an optoelectronic module with a molding, which comprises:
providing a support with an element being at least one of a transmitting element and a receiving element;
providing a module housing with an opening for introducing the support therethrough and a coupling region for coupling a component thereon;
positioning the support in the module housing to align the element with a predetermined position;
placing a rear side of a coupling lens on an end face of a dead mold, the end face of the dead mold being shaped to correspond to the rear side of the coupling lens, and introducing the coupling lens into the module housing with the dead mold;
at least partly surrounding the support and the element with a translucent, moldable material to form a molding utilizing the module housing as a casting mold while keeping the dead mold in the coupling region;

holding the coupling lens with the dead mold until the module housing is filled with the molding material; and removing the dead mold after filling the moldable material in the module housing.

28. A method for producing an optoelectronic module with a molding, which comprises:

providing a support with a transceiver element;

providing a module housing with an opening for introducing the support therethrough and a coupling region for coupling a component thereon;

positioning the support in the module housing to align the element with a predetermined position of the coupling region;

placing a coupling lens on an end face of a dead mold and locating the coupling lens at the coupling region of the module housing;

at least partly surrounding the support and the element with a translucent, moldable material to form a molding utilizing the module housing as a casting mold while keeping the dead mold at the coupling region;

holding the coupling lens with the dead mold until the module housing is filled with the molding material; and removing the dead mold after filling the moldable material in the module housing.

* * * * *